(12) United States Patent
Wang

(10) Patent No.: US 7,300,299 B2
(45) Date of Patent: Nov. 27, 2007

(54) BOARD STANDOFF DEVICE FOR ELECTRICAL CONNECTOR ASSEMBLY

(75) Inventor: Mei Hui Wang, Taipei (TW)

(73) Assignee: Advanced Connectek Inc., Taipei (TW)

( * ) Notice: Subject to any disclaimer, the term of this patent is extended or adjusted under 35 U.S.C. 154(b) by 0 days.

(21) Appl. No.: 11/448,026

(22) Filed: Jun. 7, 2006

(65) Prior Publication Data

US 2007/0105425 A1 May 10, 2007

(30) Foreign Application Priority Data

Nov. 4, 2005 (TW) .............................. 94219144 U

(51) Int. Cl.
*H01R 13/62* (2006.01)

(52) U.S. Cl. ...................................... 439/326

(58) Field of Classification Search ......... 439/325–328
See application file for complete search history.

(56) References Cited

U.S. PATENT DOCUMENTS

| 4,297,769 | A | * | 11/1981 | Coules | 174/138 D |
| 4,495,548 | A | * | 1/1985 | Matsui | 361/790 |
| 5,191,513 | A | * | 3/1993 | Sugiura et al. | 361/752 |
| 5,223,674 | A | * | 6/1993 | Reznikov | 174/138 D |
| 5,452,184 | A | * | 9/1995 | Scholder et al. | 361/799 |
| 5,754,412 | A | * | 5/1998 | Clavin | 361/804 |
| 6,124,552 | A | * | 9/2000 | Boe | 174/135 |
| 6,140,591 | A | * | 10/2000 | Osborne et al. | 174/138 E |
| 6,234,820 | B1 | * | 5/2001 | Perino et al. | 439/326 |
| 6,270,369 | B1 | * | 8/2001 | Kato et al. | 439/326 |
| 6,399,888 | B1 | * | 6/2002 | Chen | 174/138 G |
| 6,470,556 | B2 | * | 10/2002 | Boe | 29/450 |
| 6,545,878 | B2 | * | 4/2003 | Ribeiro | 361/804 |
| 6,669,313 | B2 | * | 12/2003 | Liao | 312/7.2 |
| 6,934,155 | B2 | * | 8/2005 | Aoki et al. | 361/704 |
| 6,985,367 | B1 | * | 1/2006 | Scigiel | 361/801 |
| 7,004,764 | B2 | * | 2/2006 | Boudreau et al. | 439/74 |
| 7,085,141 | B2 | * | 8/2006 | Yi | 361/804 |
| 7,114,974 | B2 | * | 10/2006 | Korsunsky et al. | 439/325 |
| 7,134,895 | B1 | * | 11/2006 | Choy et al. | 439/326 |
| 7,134,896 | B1 | * | 11/2006 | Chen | 439/326 |
| 2005/0117313 | A1 | * | 6/2005 | Wang | 361/753 |
| 2005/0164540 | A1 | * | 7/2005 | Korsunsky et al. | 439/328 |
| 2006/0090927 | A1 | * | 5/2006 | Edwards et al. | 174/138 G |
| 2006/0189196 | A1 | * | 8/2006 | Kameda | 439/326 |
| 2007/0032116 | A1 | * | 2/2007 | Liang | 439/326 |

* cited by examiner

*Primary Examiner*—Ross Gushi
(74) *Attorney, Agent, or Firm*—Troxell Law Office, PLLC

(57) ABSTRACT

A board standoff device for mounting a first circuit board (e.g., daughter card) on a second circuit board (e.g., mother board) of an electrical connector assembly is disclosed. The first circuit board has a front end pivotably secured to a card edge connector mounted on a top surface of the second circuit board adjacent a front end thereof. The board standoff device is located around a rear end of the electrical connector assembly and includes at least one unit. Each unit includes a body fastened on the second circuit board, the body including an upward inclined latch, and a locating member detachably secured onto the body. A rear end of the first circuit board is fastened between and by the locating member and the latch of each unit. The invention can save space, facilitate heat removal during operation, and is highly adaptable and durable.

7 Claims, 3 Drawing Sheets

BOARD STANDOFF DEVICE FOR ELECTRICAL CONNECTOR ASSEMBLY

BACKGROUND OF THE INVENTION

1. Field of Invention

The present invention relates to electrical connector assemblies, and more particularly to a board standoff member for detachably supporting one circuit board on the other circuit board of an electrical connector assembly.

2. Description of Related Art

Card edge connectors, for example, such as PCI (Peripheral Component Interface) and PCI Express connectors, are widely employed to connect a daughter card to a mother board. For example, U.S. Patent Application Publication No. US 2005/0164540 A1 discloses an electrical connector assembly having board hold down. Each of the board hold downs is stamped and formed from a sheet of metal. The board hold down comprises an arc-shaped body, an upward locating portion having a conic lead-in securely inserted into an engaging hole of a daughter card, two legs securely inserted into retention holes of a mother board, an anti-overstress portion extended from one end of the body, a bent tab perpendicularly extended from the anti-overstress portion, a resilient arm extended from the other end of the body, a latch formed at one end of the arm and flexibly disposed between a main portion of the anti-overstress portion and the tab, and an inclined release portion formed at one end of the latch. In an assembled state of the electrical connector assembly, a card edge connector is mounted on a top of the mother board. Further, the daughter card has its mating edge securely inserted into a slot of the card edge connector. Furthermore, the latches lock a rear edge of the daughter card to secure same in the card edge connector. When the release portion is deflected rearward to withdraw the latches, the rear edge of the daughter card rises up automatically for disengaging with the mother board.

But this is unsatisfactory for the purpose for which the invention is concerned for the following reason: The publication is applicable to the specific type of the above electrical connector assembly only. In short, it is not adaptable. Thus, a manufacturer of the product may be bothered by the problem of storing an excessive number of goods in a warehouse. This in turn can increase the manufacturing cost greatly. Thus, a need for improvement exists.

SUMMARY OF THE INVENTION

It is therefore one object of the present invention to provide a board standoff device for electrical connector assembly having the advantages of saving space and facilitating heat removal during operation.

It is another object of the present invention to provide a board standoff device for electrical connector assembly having the advantage of being highly adaptable so as to significantly decrease the number of such goods stored in a warehouse in a prescribed period of time.

It is a further object of the present invention to provide a board standoff device for electrical connector assembly having the advantages of increased structural strength, errorless assembly, and prolonged period of useful time.

To achieve the above and other objects, the present invention provides a board standoff device for mounting a first circuit board on a second circuit board of an electrical connector assembly, the first circuit board having a front end pivotably secured to a card edge connector mounted on a top surface of the second circuit board adjacent a front end thereof, the board standoff device being located around a rear end of the electrical connector assembly and comprising at least one unit each comprising a body fastened on the second circuit board, the body including an upward inclined latch, and a locating member detachably secured onto the body, wherein a rear end of the first circuit board is fastened between and by the locating member and the latch of each unit.

In one aspect of the present invention the body is of U-section and further comprises a top surface having an opening, two legs each having a lead-in portion extended downward into the second circuit board a flexible arc-shaped member extended rearward from one leg, the arc-shaped member having a resilient arm having its end disposed in close proximity to the other leg, and a bent tab extended laterally to be in close proximity to the arm.

In one aspect of the present invention the first circuit board comprises at least one rear engaging hole such that pressing the first circuit board onto the board standoff device by aligning the engaging hole with the locating member will fasten the locating member in the engaging hole after sliding down the rear end of the first circuit board along the inclined surface of the latch.

In another aspect of the present invention the latch is extended upward from an intermediate portion of the arc-shaped member. When the latches are pushed rearward by pulling the arms away from the tabs, a rear end of the first circuit board rises up automatically to disengage with the second circuit board.

In a further aspect of the present invention the tab is adapted to prevent the arm from bending excessively in the fastening or unfastening operation of the electrical connector assembly.

The above and other objects, features and advantages of the present invention will become apparent from the following detailed description taken with the accompanying drawings.

DETAILED DESCRIPTION OF THE INVENTION

Figure 1:
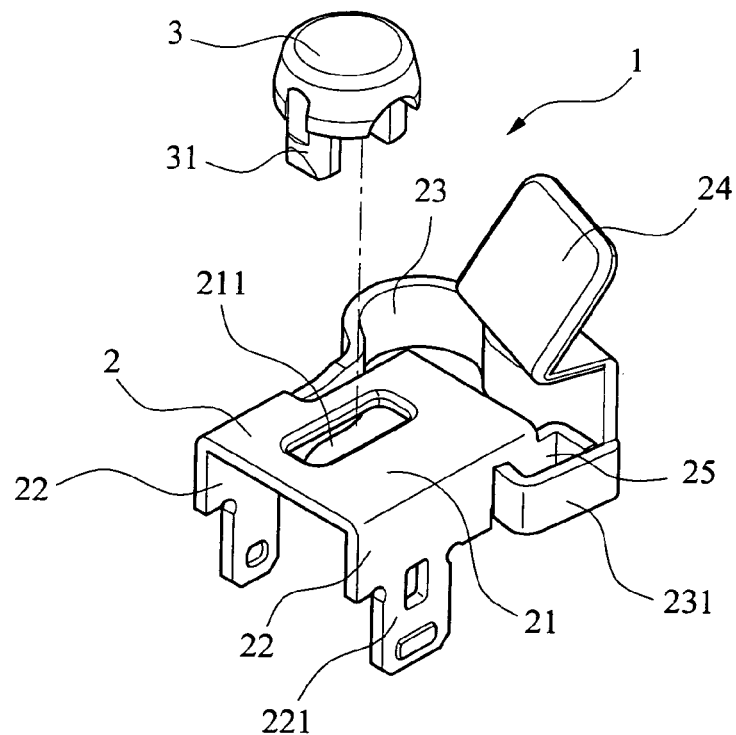
FIG. 1 is an exploded perspective view of a first preferred embodiment of board standoff member for electrical connector assembly according to the invention.
Figure 2:
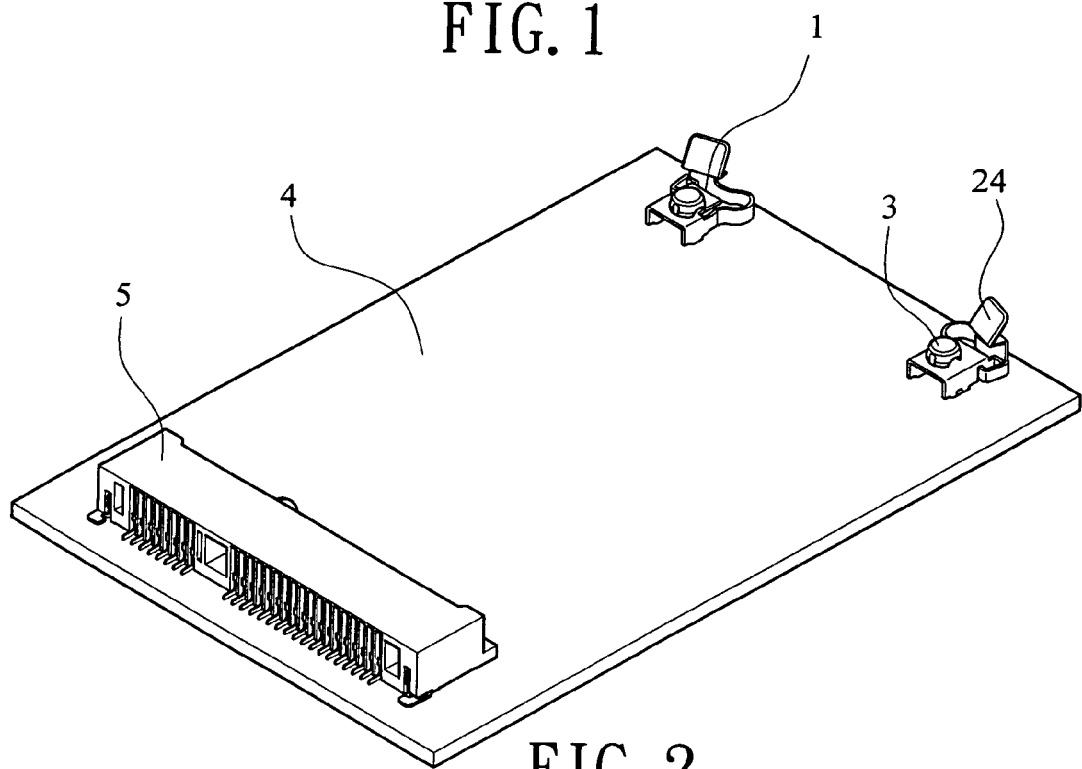
FIG. 2 is a perspective view of the board standoff members mounted on a top of a mother board.
Figure 3:
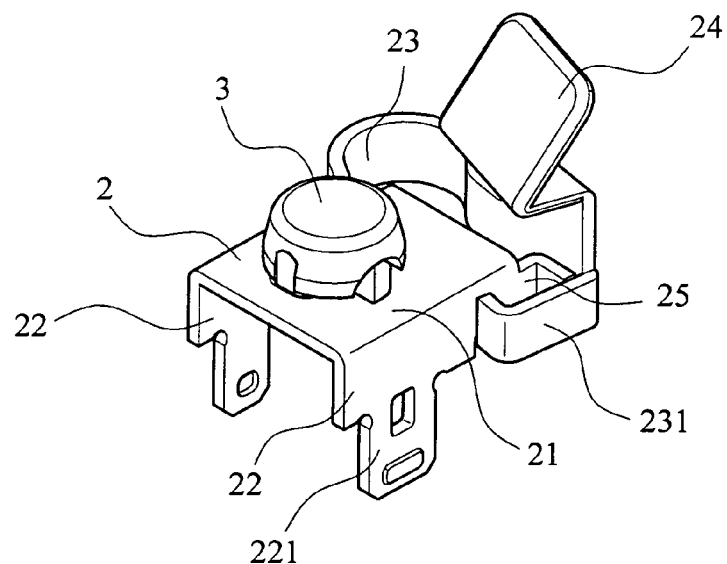
FIG. 3 is a perspective view of the assembled board standoff member.
Figure 4:
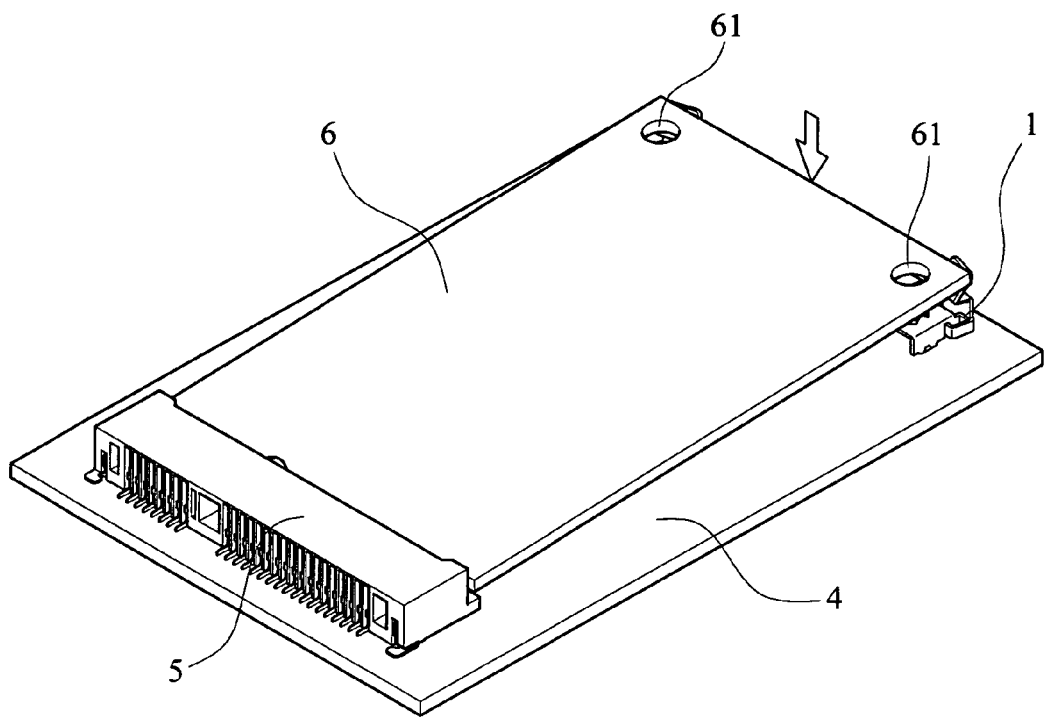
FIG. 4 is a perspective view showing a daughter card being mounted on the mother board of FIG. 2 by securing to the board standoff members.

Referring to FIGS. 1 to 4, an electrical connector assembly having two board standoff members 1 each constructed in accordance with a first preferred embodiment of the invention is shown. The board standoff member 1 comprises a body 2 of inverted U-section and a detachable locating member 3. Each component is discussed in detailed below.

The body 2 comprises a top surface 21 having a substantially rectangular opening 211, two legs 22 formed by two opposite vertical portions of the body 2, each leg 22 having a lead-in portion 221 extended downward, a flexible arc-shaped member 23 extended rearward from a joining portion of one leg 22 and the top surface 21, the arc-shaped member 23 having a resilient arm 231 having its end disposed in close proximity to the other leg 22, an inclined latch 24 extended upward from an intermediate portion of the arc-shaped member 23, and a bent tab 25 extended laterally to be in close proximity to the arm 231.

The button-like locating member 3 comprises two opposite, flexible positioning pegs 31 extended downward. In assembly of the electrical connector assembly, an elongated edge card connector 5 is first mounted on a top surface of a mother board 4 adjacent a front end thereof. Next, insert the positioning pegs 31 into the opening 211 for securing either locating member 3 onto the top surface 21 of the body 2. Next, securely insert the lead-in portions 221 of the legs 22 of either board standoff member 1 into two retention holes (not shown) of the mother board 4 proximate a rear end thereof. Next, pivotably mount a front end of a daughter card 6 at a slot of the edge card connector 5 by insertion. Finally, press the daughter card 6 onto the board standoff members 1 by aligning two engaging holes 61 at two rear corners with the locating members 3 until the rear end of the daughter card 6 is fastened by and between the locating member 3 and a substantially horizontal portion of the latch 24 at either rear corner after sliding down along inclined surfaces of the latches 24. In this fastened position, the daughter card 6 is maintained in a parallel relationship with the mother board 4 with a predetermined distance formed therebetween.

To the contrary, when the latches 24 are pushed rearward by pulling the arms 231 away from the tabs 25, the rear end of the daughter card 6 rises up automatically to disengage with the mother board 4. The provision of the tab 25 is adapted to prevent the arm 231 from bending excessively in the fastening or unfastening operation of the electrical connector assembly.

Figure 5:
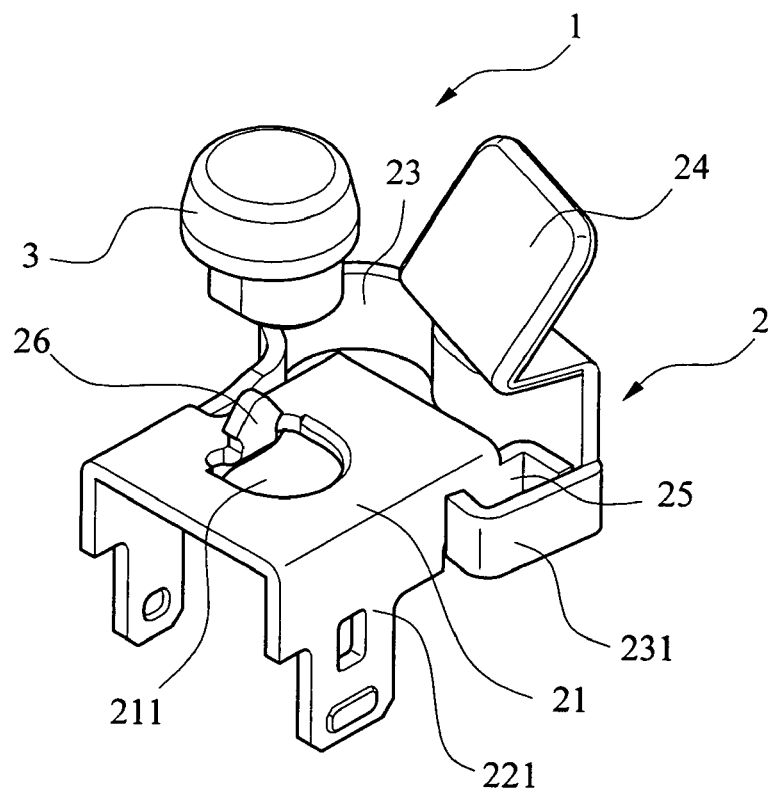
FIG. 5 is an exploded perspective view of a second preferred embodiment of board standoff member for electrical connector assembly according to the invention.

Referring to FIG. 5, a board standoff member for electrical connector assembly in accordance with a second preferred embodiment of the invention is shown. The second embodiment is identical to the first embodiment, except that the opening 211 is shaped somewhat like a circle. Further, a post 26 having a tapered end is formed on an edge of the opening 211. The locating member 3 is dimensioned and shaped to fit securely in the opening 211 by inserting the post 26 into a mating recess (not shown) of the locating member 3.

Figure 6:
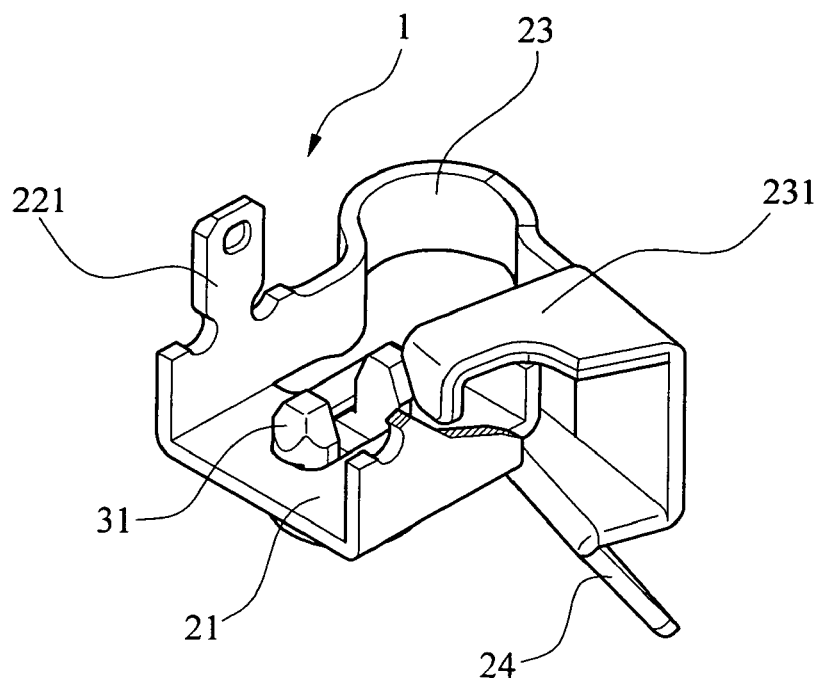
FIG. 6 is a perspective view of a third preferred embodiment of board standoff member for electrical connector assembly according to the invention.

Referring to FIG. 6, a board standoff member for electrical connector assembly in accordance with a third preferred embodiment of the invention is shown The third embodiment is identical to the first embodiment, except that the lead-in portions 221 are different in shape and the arm 231 is aligned with the latch 24 vertically, i.e., the arm 231 is formed under the body 2.

While the invention herein disclosed has been described by means of specific embodiments, numerous modifications and variations could be made thereto by those skilled in the art without departing from the scope and spirit of the invention set forth in the claims.

What is claimed is:

1. A board standoff device for mounting a first circuit board on a second circuit board of an electrical connector assembly, the first circuit board having a front end pivotably secured to a card edge connector mounted on a top surface of the second circuit board adjacent a front end thereof, the board standoff device being located around a rear end of the electrical connector assembly and comprising at least one unit each comprising a body fastened on the second circuit board, the body including an upward inclined latch, and a locating member detachably secured onto the body, wherein a rear end of the first circuit board is fastened between and by the locating member and the latch of each unit, wherein the body comprises a substantially rectangular opening formed on a top surface thereof, and wherein the locating member comprises two opposite, flexible positioning pegs extended downward and adapted to insert into the opening for fastening.

2. The board standoff device of claim 1, wherein the body comprises an opening having a curved edge, the opening including a post having a tapered end formed on an edge thereof, and wherein the locating member comprises a recess adapted to matingly receive the post for fastening the locating member on the opening.

3. The board standoff device of claim 1, wherein the body has an inverted U-section and comprises two legs each having a lead-in portion extended downward and adapted to insert into the second circuit board for fastening.

4. The board standoff device of claim 3, wherein the body further comprises a flexible arc-shaped member extended rearward from one leg, and wherein the latch is extended upward from an intermediate portion of the arc-shaped member.

5. The board standoff device of claim 4, wherein the arc-shaped member comprises a resilient arm having an end thereof disposed in close proximity to the other leg, and a bent tab extended from the other leg to be in close proximity to the arm.

6. The board standoff device of claim 5, wherein the arm is disposed externally of the tab.

7. The board standoff device of claim 5, wherein the arm is disposed under the tab.

* * * * *